United States Patent [19]

Riemer et al.

[11] 4,278,831
[45] Jul. 14, 1981

[54] PROCESS FOR FABRICATING SOLAR CELLS AND THE PRODUCT PRODUCED THEREBY

[75] Inventors: Dietrich E. Riemer, Auburn; Rudolph E. Corwin, Seattle, both of Wash.

[73] Assignee: The Boeing Company, Seattle, Wash.

[21] Appl. No.: 122,828

[22] Filed: Feb. 20, 1980

Related U.S. Application Data

[63] Continuation-in-part of Ser. No. 33,887, Apr. 27, 1979, abandoned.

[51] Int. Cl.³ .................... H01L 31/04; H01L 31/18
[52] U.S. Cl. .................................. 136/256; 29/572; 427/74; 427/88; 357/30; 357/65; 148/188
[58] Field of Search ............. 136/89 CC, 89 SG, 256, 136/261; 427/74, 88; 29/572; 148/186–188; 357/30, 65

[56] References Cited

U.S. PATENT DOCUMENTS

| | | | |
|---|---|---|---|
| 3,416,044 | 12/1968 | Dreyfus et al. | 357/30 |
| 3,679,949 | 7/1972 | Uekusa et al. | 357/30 |
| 4,011,578 | 3/1977 | Bollen et al. | 357/30 |

OTHER PUBLICATIONS

P. A. Iles et al., "Design Factors for Transparent Conducting Layers in Solar Cells", *Conf. Record, 12th IEEE Photovoltaic Specialists Conf.*, Nov. 1976, pp. 978–988.
H. J. Hovel et al., "Photovoltaic Devices Using Transparent Contacts", *IBM Tech. Disc. Bull.*, vol. 18, p. 1575 (1975).
J. Michel et al., "Electrical Characterization of Silicon Diffused Layers", Proceedings Int'l Photovoltaic Solar Energy Conf., Luxembourg, Sep. 1977, Reidel Pub. Co. (1978), pp. 125–134.
L. Frisson et al., "Screen Printed Contacts on Silicon Solar Cells with Low Series Resistance", *Conf. Record, 13th IEEE Photovoltaic Specialists Conf.* (1978), pp. 590–592.

*Primary Examiner*—Aaron Weisstuch
*Attorney, Agent, or Firm*—Cole, Jensen & Puntigam

[57] ABSTRACT

An electrically conductive, anti-reflective coating is formed on a base layer of prepared silicon in such a manner as to form a good ohmic contact therewith. If doped, the coating can serve as an impurity source during a following diffusion step, in which a PN junction is formed in the silicon. Undoped coatings may be used when the PN junction has previously been formed in the silicon. Thick film electrical contacts are then formed by screen printing on the top surface of the anti-reflective coating and then fired at high temperature, i.e. 500°–1000° C. The material comprising the coating is such that it acts as a barrier to the diffusion of the metal forming the electrical contacts into the silicon base layer during the firing of the thick film contacts. Since the coating is electrically conductive, a conductive path between the contacts and the silicon is established.

13 Claims, 6 Drawing Figures

PROCESS FOR FABRICATING SOLAR CELLS AND THE PRODUCT PRODUCED THEREBY

BACKGROUND OF THE INVENTION

This application is a continuation-in-part of application Ser. No. 33,887, filed Apr. 27, 1979 and now abandoned, in the names of Dietrich Riemer and Rudolph Corwin, titled "Process For Fabricating Solar Cells and the Product Produced Thereby."

This invention relates generally to the art of solar cells, and more specifically concerns a process for manufacturing solar cells using an electrically conductive anti-reflective coating which acts as a barrier to prevent diffusion of the metal forming the electrical contacts into the silicon base layer, and the product produced thereby.

The virtually unlimited availability of energy from the sun in a time when other energy sources, such as petroleum, are becoming increasingly scarce, has resulted in a greater emphasis on use of devices which utilize solar energy. The conventional solar cell, which typically includes a base layer of silicon in which a PN junction is formed, is a device which directly converts solar energy into electricity, as opposed to other solar energy devices, such as solar collectors, which use the light energy from the sun to produce steam, which in turn is used to produce electricity.

Solar cells, although having certain operational advantages over other solar devices, have not been extensively commercially used, because heretofore they have been expensive to manufacture, such that they have not been cost competitive even with other solar devices. The high cost of manufacture is primarily due to the fact that the conventional process for producing solar cells involves a large number of separate steps, several of which are difficult to implement. Hence, solar cells currently are impractical for use on a large scale, even in view of the high cost of other forms of energy.

Accordingly, it is a general object of the present invention to provide a process for manufacturing solar cells and the product produced thereby which overcomes one or more of the disadvantages of the prior art noted above.

Another object of the present invention is to provide such a process which reduces the cost of manufacture of solar cells.

An additional object of the present invention is to provide such a process in which the anti-reflective coating need not be removed prior to the deposition of the electrical contacts.

A further object of the present invention is to provide such a process which reduces the time and number of steps involved in the manufacture of solar cells.

Another object of the present invention is to provide such a product in which a good electrically conductive path exists between the exterior electrical contacts and the base silicon layer, through the anti-reflective coating.

It is a still further object of the present invention to provide such a product in which, in one embodiment, the anti-reflective coating is doped.

It is yet another object of the present invention to provide such a process and product in which the anti-reflective coating acts as a barrier to the diffusion of the metal forming the electrical contacts into the silicon base layer during the firing of the contacts.

SUMMARY OF THE INVENTION

The process includes the initial step of forming a substantially transparent, anti-reflective, electrically conducting, barrier coating on one surface of a silicon base layer. In the silicon base layer of the completed product, a PN junction is present. The PN junction is either present in the silicon base layer when the coating is formed, or is formed in the silicon base layer after the coating has been formed on the silicon, typically by diffusing doping impurities present in the coating into the silicon. In the next step of the process, thick film, electrically conducting contacts are formed on the upper surface of the coating. The thick film contacts are then fired at temperatures sufficient for thick film application to provide a good low resistance ohmic contact between the thick film contacts and the coating. The material comprising the coating is such that it acts as a barrier to the diffusion of the material forming the thick film contacts during the step of firing thereof, and also is such that it does not diffuse into the silicon to such an extent to harm the junction in the silicon during the steps of the process. The resulting product thus includes a silicon base layer with a PN junction formed therein relatively close to the one surface of the silicon base layer, an anti-reflective barrier coating, which is electrically conductive, on one surface of the silicon base layer, and thick film fired contacts on the upper surface of the barrier layer. The silicon base layer, including the junction therein, is free of harmful diffusion from both the coating and the thick film contacts.

DESCRIPTION OF THE DRAWINGS

A more thorough understanding of the invention may be obtained by a study of the following detailed description taken in connection with the accompanying drawings in which.

DESCRIPTION OF THE PREFERRED EMBODIMENT

The process described and claimed herein begins with a base layer of silicon. The product produced by the process is a solar cell having the capability of directly transforming solar energy into electrical energy. Selected materials, with particular characteristics, are used in the process which account for a significant simplification of the manufacture of solar cells and a corresponding reduction in the cost of producing solar cells.

Figure 1:
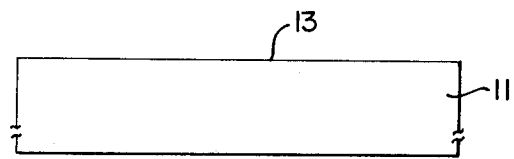
FIG. 1 is an elevational view of the base layer of silicon used in the process of the present invention.

FIG. 1 shows a base layer of silicon 11. The silicon base layer 11 may typically be 0.010 inches thick. In a preliminary step of the process of the present invention, the native silicon dioxide layer which may be present on the upper surface 13 of base layer 11, due to processing, handling or storage, is removed.

Figure 2:
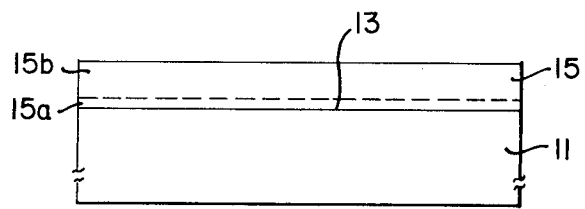
FIG. 2 is an elevational view which illustrates the result of the first step of the process of the present invention.

In the first step of the process, shown in FIG. 2, an anti-reflective coating layer 15 is deposited on the upper surface 13 of base layer 11. The coating layer 15 comprises a material which is anti-reflecting, electrically conducting, and capable of being doped, so that the coating layer can serve, if desired, as an impurity source for the formation of the PN junction in the silicon base layer 11. The material must be such that it acts as a barrier to the diffusion of the metal comprising the electrical contacts into the silicon base layer under high temperature conditions. The importance of this characteristic will be discussed in detail in following paragraphs. The coating is transparent, permitting light through to the silicon base layer and is electrically conducting, which results in a good current path between the electrical contacts of the solar cell, and between the electrical contacts and the silicon base layer. This results in a fast and good electrical drain of the current from the cell. Examples of materials suitable for the coating are tin oxide, indium oxide, and combinations of tin and indium oxide.

In this step of depositing coating layer 15 on base layer 11, it is important that there results a good area ohmic contact between the coating layer and the silicon of the base layer. Hence, the preliminary step of removing the silicon dioxide is important to the success of this depositing step. Further, the depositing step shown in FIG. 2 is usually done in a reducing type atmosphere, such as hydrogen, at elevated temperatures, i.e. 500° C., in order to eliminate any remaining silicon dioxide and prevent formation of any new oxide on the upper surface 13 of silicon base layer 11.

The coating layer 15 is typically ¼ wavelength thick or approximately 600 angstroms. The thickness of the coating may be increased, however, to as much as ¾ wavelength, in order to obtain sufficient impurities for the formation of the PN junction, if necessary, in the diffusion step. Referring to FIG. 2, coating layer 15, which is electrically conductive, is shown in one alternative divided into portions 15a and 15b, for the embodiment in which a PN junction is not formed preliminarily in the silicon base layer. 15a refers to a heavily doped region just adjacent the silicon base layer 11, while 15b refers to a lightly doped region which functions as an anti-reflective coating.

The doping of coating layer 15, into regions 15a and 15b, is accomplished through the addition of impurities. These impurities, when diffused in base layer 11, from coating layer 15, form the PN junction in the silicon base layer. The PN junction is responsible for the direct energy conversion capability of the solar cell. One example of a suitable impurity material is antimony, although other materials may be successfully used.

In another alternative, the coating 15 may be uniformly doped throughout its thickness. In another embodiment, the PN junction is initially formed in the silicon base layer, before the coating layer 15 is deposited. In this embodiment, coating layer 15 will not be doped as an impurity source, but will have sufficient impurities to be electrically conducting.

Figure 3:
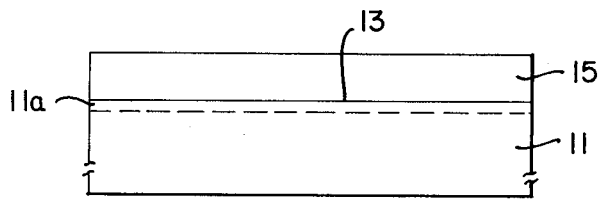
FIG. 3 is an elevational view which illustrates the result of the second step of the process of the present invention.

The next step in the process, for the embodiment where there is no initial PN junction in the silicon base layer, is illustrated in FIG. 3, and involves a conventional diffusing step, by which the impurities in region 15a migrate down into the silicon of base layer 11 to form the required PN junction. At the conclusion of step 3, there is a PN junction, referenced at 11a, formed near the surface 13 of base layer 11.

Figure 4:
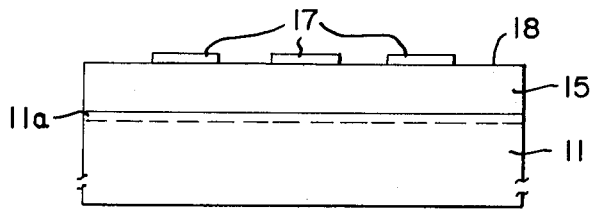
FIG. 4 is an elevational view which illustrates the result of the third step of the process of the present invention.

In the next step, shown in FIG. 4, electrically conducting contacts 17 are formed on the upper surface 18 of coating layer 15. The contacts 17 provide connections between the solar cell and external circuitry.

Presently, the primary means of forming contacts 17 and 19 is by conventional thin film methods, which refers to a process by which material is laid down by vacuum deposition in minute thicknesses by repeated passes. A typical thin film contact might be in the range of 1000 to 10,000 angstroms thick, although the contact thickness could be increased by additional passes. This is done at relatively low temperatures, i.e. less than 200° C. An intermediate layer of titanium or chrome is frequently used with many contact metals, including silver, which is the metal currently used for solar cell contacts, to provide the desired low resistance ohmic contact between the silicon and the contact metal. The thin film process is, however, very expensive, and time-consuming, and makes current solar cell technology impractical for a large number of terrestrial applications.

Contacts have also been formed directly on the silicon using thick film techniques, which refers to a process in which the contacts are screen printed and then fired. Typically the contacts laid down by such a process are in the range of 5-25 microns thick, although it is the process steps, i.e. screen printing and firing, which identifies thick film techniques, rather than the thickness per se. The thick film contacts are fired at high temperature to provide the desired electrical contact between the contacts and the silicon. This is a much faster and much less expensive process than thin film vacuum methods, but it is high temperature, i.e., typically 500°-1000° C., and although the thick film firing results in a low resistance contact to the high resistance silicon, the high temperatures employed result in a rapid alloying of the contact metal and the silicon, with the contact metal diffusing deep into the silicon, including the junction. This disastrously affects the carrier lifetime, and likely leads to a shorting of the junction, thus destroying or at least seriously degrading the device.

Some diffusion is necessary, of course, to achieve the desired low contact resistance between the metal contact and the silicon. However, the thick film process is not an equilibrium process, and it is very difficult to control the process precisely enough so that there is sufficient diffusion to produce the desired low resistance contact but not so much as to seriously harm the PN junction in the silicon. The penetration of the silicon by the contact metal, once initiated, proceeds very rapidly and is very difficult to terminate short of the junction, particularly in the solar cells, where the junctions are so close to the surface of the silicon base layer.

Another difficulty with conventional thick film methods is the increased potential for inadvertent creation of a rectifying junction in the silicon base layer, due to the use of thick film inks which include traces of dopant materials. Hence, the use of thick film techniques to produce the solar cell contacts has been heretofore characterized by severe process control problems and large variation in quality between successive batches.

Attempts have been made to modify the conventional thick film process, so that it can be used for solar cells, because of its known cost advantages. In one attempt, the thick film process is terminated while the contact resistance between the thick film contact and the silicon is still high, i.e., before any alloying and subsequent penetration occurs. The solar cell, with contacts, is then heat treated in either a hydrogen atmosphere or an acid bath to reduce the contact resistance. Although it is uncertain what causes the reduction in the contact resistance, it is believed that the hydrogen, which quickly diffuses in solid material, is adsorbed at the joint between the electrical contact and the silicon, forming an electrical bridge by ionic bond. This method, however, is expensive, time consuming, and has not proven to be reliable.

Using an intermediate layer of titanium or chrome, as is used in the thin film process, is also not effective, because such materials, being highly reactive metals, will rapidly oxidize in the high temperature, oxidizing atmosphere used for the thick film process, which in turn results in a poor electrical connection between the contact metal and the silicon base layer. This problem is not encountered in a thin film process, since such a process is carried out in a vacuum.

A particular feature of the present invention is the use of an electrically conductive oxide, such as tin oxide with antimony doping or indium tin oxide, as a barrier layer, i.e., a layer which prevents diffusion of the contact metal into the silicon base layer and which also provides an electrical bridge between the contacts and the silicon base layer. The oxide thus must be electrically conducting and, after being laid down on the silicon base layer, must act as a barrier to the diffusion of the contact metal into the silicon base layer during the high temperature thick film process. Second, the oxide, or other material used, must itself be non-diffusing, i.e., when it is laid down on the silicon, it must not itself diffuse into the silicon to the point where it would harm the junction.

Thus, the material used for the intermediate barrier layer must have characteristics which match it both to (1) the silicon, i.e., the material should not diffuse in silicon, and (2) the particular contact metal, i.e., the material should act as a barrier to diffusion of the particular metal being used for the contacts. The oxide described above also acts as a physical barrier to the other impurities in the thick film ink, thereby solving the above-described junction problems caused by diffusion of dopants in the ink. As explained above, the oxide coating, in the embodiment shown, is laid down by chemical vapor deposition, in a reducing atmosphere, at a temperature of approximately 500° C. Typically, it is approximately $\frac{1}{4}$ wavelength thick, i.e. about 600 angstroms, although in some cases, it may be necessary to use a $\frac{3}{4}$ wavelength thickness to achieve the necessary barrier characteristics.

As mentioned above, the oxide barrier layer may also serve as a doping source for the PN junction, or as a protective upper layer for the solar cell, to reduce surface recombination velocity. Further, it acts as an antireflective coating, which, because it is applied on the silicon as a first step, but, being conductive, does not require etching, results in further cost savings. Primarily, however, the use of a barrier layer having the above-described properties is significant because it permits the use of inexpensive thick film methods for application of the electrical contacts.

Also, it permits the use of metals which are less expensive than silver. In the past, copper could not be used even for the moderate temperature thin film process, because of its very high diffusion characteristics relative to silicon. However, tin oxide is a good barrier to copper, so that less expensive, but equally desirable, copper contacts can be used. Thus, a substantial savings in time and money is accomplished, by the use of the disclosed conductive oxide as a barrier layer between the silicon and the metal contacts. Further, the process is essentially an equilibrium process so that a high quality product can be reproduced on a quantity basis.

In the embodiment shown, the contacts are thus presently formed by screen printing and firing, which results in a good ohmic contact between contacts 17 and the coating 15. The screen printing and firing process per se is well known and conventional.

Because coating layer 15 is electrically conducting, and because there is good ohmic contact between coating layer 15 and base layer 11 and between contacts 17 and coating layer 15, there will also be good electrical contact between contacts 17 and base layer 11. Hence, there is a good current path between contacts 17 and the base layer 11, through the coating layer 15. In previous methods, the coating layer was typically etched down to base layer 11 to provide a good current path between the contacts and the silicon base layer.

Figure 5:
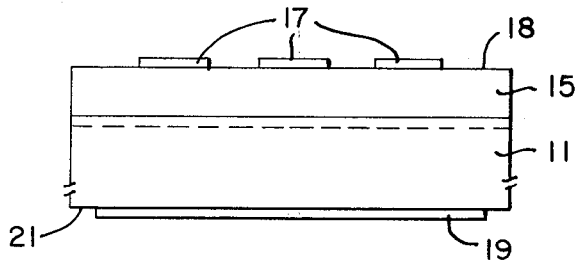
FIG. 5 is an elevational view which illustrates the result of the fourth step of the process of the present invention.

In the next step in the process, shown in FIG. 5, an electrically conducting layer contact 19, such as aluminum, is deposited on the back surface 21 of the silicon base layer 11.

Figure 6:
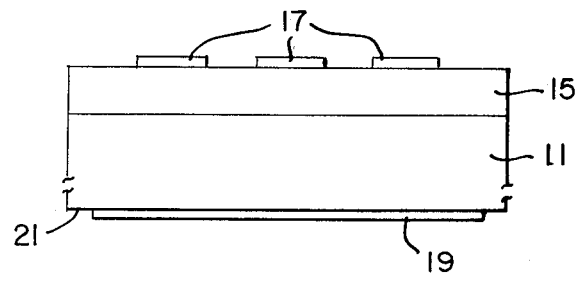
FIG. 6 is an elevational view showing the product of the present invention resulting from the steps of FIGS. 1-5.

The structure resulting from the steps of FIGS. 1–5, shown in FIG. 6, is the completed solar cell, and may be used in conventional solar cell applications.

Thus, a process for manufacturing solar cells has been disclosed which makes use of a coating which is antireflective, electrically conducting, and which, when properly doped, serves as a source of impurities for the formation of the required PN junction in the silicon base layer. The coating also acts as a barrier to the diffusion of the material comprising the metal contacts into the silicon, which would tend to destroy the junction. With the use of such a coating, many steps in prior art manufacturing processes are eliminated: thick film processing techniques may be used, and lower cost contact metals may be used, thus reducing the complexity and cost of the manufacturing process.

Although an exemplary embodiment of the invention has been disclosed herein for purposes of illustration, it should be understood that various changes, modifications and substitutions may be incorporated in such embodiment without departing from the spirit of the invention as defined by the claims which follow.

What is claimed is:

1. A process for fabricating solar cells comprising the steps of:
    a. forming a substantially transparent, electrically conducting, anti-reflective, barrier coating on one surface of a silicon base layer, in which a PN junction has been or is to be formed near the one surface thereof;
    b. forming an electrically conducting thick film contact on the one surface of said barrier coating; and
    c. firing said thick film contact at conventional thick film process temperatures without the material comprising said thick film contact penetrating through said barrier coating to said silicon base layer, wherein the material comprising said barrier coating is such that it (1) acts as a barrier to the diffusion of the material comprising the thick film contact during the step of firing the contact, thereby preventing diffusion of said thick film contact material into the silicon base layer, and further such that it (2) does not itself diffuse into the silicon base layer when the barrier coating is formed thereon, so that a path for electrical current is established between said thick film contact and the silicon base layer through said barrier coating without a diffusion of either said coating material or said contact material into the silicon base layer to such an extent to detrimentally affect the operation of the solar cell.

2. A process of claim 1 wherein the temperature of the step of firing is approximately within the range of 500° C. to 1000° C.

3. A process of claim 2, wherein the step of firing is carried out in an oxidizing atmosphere at standard atmospheric pressure.

4. A process of claim 2, wherein the step of forming the thick film contacts is carried out by screen printing.

5. A process of claim 1, wherein the thickness of said barrier coating is approximately within the range of one-quarter to three-quarter wavelengths thick.

6. A process of claim 1, wherein the material comprising said coating is an electrically conductive oxide, and the material comprising the thick film contact is copper.

7. A process of claim 1, including the step of forming an electrically conducting layer on the other surface of the silicon base layer.

8. A process of claim 1, wherein when the PN junction is formed in the silicon base layer following the step of forming the barrier coating, the coating includes doping impurities, and wherein the process includes the step of diffusing said doping impurities initially present in said barrier coating into the silicon base layer to form the PN junction.

9. A process of claim 8, wherein said barrier coating includes a first region adjacent the silicon base layer which is relatively heavily doped, and a second, remaining region which is substantially less heavily doped then said first region.

10. The product produced by the process comprising the steps of:
  a. forming a substantially transparent, electrically conducting, anti-reflective, barrier coating on one surface of a silicon base layer, in which a PN junction has been or is to be formed near the one surface thereof;
  b. forming an electrically conducting thick film contact on the one surface of said barrier coating; and
  c. firing said thick film contact at conventional thick film process temperatures without the material comprising said thick film contact penetrating through said barrier coating to said silicon base layer, wherein the material comprising said barrier coating is such that it (1) acts as a barrier to the diffusion of the material comprising the thick film contact during the step of firing the contact, thereby preventing diffusion of said thick film material into the silicon base layer, and further such that it (2) does not itself diffuse into the silicon base layer when the barrier coating is formed thereon, so that a path for electrical current is established between said thick film contact and the silicon base layer through said barrier coating without a diffusion of either said coating material or said contact material into said silicon base layer to such an extent to detrimentally affect the operation of the solar cell.

11. A solar cell, comprising:
  a silicon base layer having a PN junction formed therein;
  a substantially transparent, electrically conducting, anti-reflective, barrier coating formed on one surface of said silicon base layer; and
  an electrically conducting, thick film contact formed on the one surface of said barrier coating, so that a current path exists between said thick film contact and said silicon base layer, said barrier coating comprising a material (1) which is a barrier to the diffusion of the material comprising said thick film contact at the high temperatures necessary for firing thereof, and (2) which does not itself diffuse into said silicon base layer when applied thereto as the barrier coating.

12. The article of claim 11, wherein said barrier coating is approximately in the range of one-quarter to three-quarters wavelength thick.

13. The article of claim 11, wherein the material comprising said barrier coating is an electrically conducting oxide, and the material comprising said thick film contact is copper.

* * * * *